United States Patent
Moon et al.

(10) Patent No.: US 8,039,860 B2
(45) Date of Patent: Oct. 18, 2011

(54) LIGHT EMITTING DEVICE, LIGHT EMITTING DEVICE PACKAGE AND LIGHTING SYSTEM

(75) Inventors: Ji Hyung Moon, Seoul (KR); Hwan Hee Jeong, Seoul (KR); Sang Youl Lee, Seoul (KR); June O Song, Seoul (KR); Kwang Ki Choi, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/024,874

(22) Filed: Feb. 10, 2011

(65) Prior Publication Data
US 2011/0193123 A1    Aug. 11, 2011

(30) Foreign Application Priority Data
Feb. 11, 2010    (KR) .................. 10-2010-0013041

(51) Int. Cl.
*H01L 33/00* (2010.01)
(52) U.S. Cl. ............ 257/98; 257/E33.056; 257/E33.067
(58) Field of Classification Search .................... 257/98, 257/E33.056, E33.067
See application file for complete search history.

(56) References Cited

FOREIGN PATENT DOCUMENTS

| JP | 2001-150719 A | 6/2001 |
|---|---|---|
| JP | 2006-024595 A | 1/2006 |
| KR | 10-2005-0014343 A | 2/2005 |
| WO | WO 2005/013382 A1 | 2/2005 |

*Primary Examiner* — David S Blum
(74) *Attorney, Agent, or Firm* — Birch, Stewart, Kolasch & Birch, LLP

(57) ABSTRACT

Disclosed are a light emitting device and a light emitting device package having the same. The light emitting device includes a light emitting structure layer including a first conductive type semiconductor layer, an active layer under the first conductive type semiconductor layer, and a second conductive type semiconductor layer under the active layer; a conductive layer under the second conductive type semiconductor layer; an adhesive layer under the conductive layer; a support member under the adhesive layer; a contact electrode connected to the first conductive type semiconductor layer; a first lead electrode under the support member; a first electrode connecting the contact electrode to the first lead electrode on a first region of the support member; a second electrode connected to at least one of the conductive layer and the adhesive layer on a second region of the support member; a second lead electrode connected to the second electrode under the support member; and a first insulating layer between the contact electrode and the light emitting structure layer.

12 Claims, 13 Drawing Sheets

LIGHT EMITTING DEVICE, LIGHT EMITTING DEVICE PACKAGE AND LIGHTING SYSTEM

The present application claims priority of Korean Patent Application No. 10-2010-0013041 filed on Feb. 11, 2010, which is hereby incorporated by reference in its entirety.

BACKGROUND

The embodiment relates to a light emitting device and a light emitting device package and light system.

Groups III-V nitride semiconductors have been extensively used as main materials for light emitting devices, such as a light emitting diode (LED) or a laser diode (LD), due to the physical and chemical characteristics thereof. In general, the groups III-V nitride semiconductors include semiconductor materials having the compositional formula of $In_xAl_yGa_{1-x-y}N$ ($0 \leq x \leq 1$, $0 \leq y \leq 1$, and $0 \leq x+y \leq 1$).

The LED is a semiconductor device, which transmits/receives signals by converting an electric signal into infrared ray or light using the characteristics of compound semiconductors. The LED is also used as a light source.

The LED or the LD using the nitride semiconductor material is mainly used for the light emitting device to provide the light. For instance, the LED or the LD is used as a light source for various products, such as a keypad light emitting part of a cellular phone, an electric signboard, and a lighting device.

SUMMARY

The embodiment provides a light emitting device having a new vertical electrode type structure.

The embodiment provides a vertical type light emitting device having no pad on a semiconductor layer.

A light emitting device according to the embodiment includes, a light emitting structure layer including a first conductive type semiconductor layer, an active layer under the first conductive type semiconductor layer, and a second conductive type semiconductor layer under the active layer; a conductive layer under the second conductive type semiconductor layer; an adhesive layer under the conductive layer; a support member under the adhesive layer; a contact electrode connected to the first conductive type semiconductor layer; a first lead electrode under the support member; a first electrode connecting the contact electrode to the first lead electrode on a first region of the support member; a second electrode connected to at least one of the conductive layer and the adhesive layer on a second region of the support member; a second lead electrode connected to the second electrode under the support member; and a first insulating layer between the contact electrode and the light emitting structure layer.

A light emitting device according to the embodiment includes, a light emitting structure layer including a first conductive type semiconductor layer, an active layer under the first conductive type semiconductor layer, and a second conductive type semiconductor layer under the active layer; a conductive layer under the second conductive type semiconductor layer; an adhesive layer under the conductive layer; a support member under the adhesive layer; a second electrode connected to the adhesive layer on a first region of the support member; a first electrode connected to the conductive layer on a second region of the support member; a contact electrode extending from the adhesive layer to an inside of the first conductive type semiconductor layer; an insulating layer on at least one side of the contact electrode, the first electrode and the second electrode; a first lead electrode connected to the first electrode under the support member; and a second lead electrode connected to the second electrode under the support member.

A light emitting device package according to the embodiment includes, a body; first and second lead frames on the body; a light emitting device on at least one of the first and second lead frames; and a molding member for molding the light emitting device, wherein the light emitting device may include a light emitting structure layer including a first conductive type semiconductor layer, an active layer under the first conductive type semiconductor layer, and a second conductive type semiconductor layer under the active layer; a conductive layer under the second conductive type semiconductor layer; an adhesive layer under the conductive layer; a support member under the adhesive layer; a contact electrode connected to the first conductive type semiconductor layer; a first lead electrode under the support member; a first electrode connecting the contact electrode to the first lead electrode on a first region of the support member; a second electrode connected to at least one of the conductive layer and the adhesive layer on a second region of the support member; a second lead electrode connected to the second electrode under the support member; and a first insulating layer between the contact electrode and the light emitting structure layer.

DETAILED DESCRIPTION OF THE EMBODIMENTS

Figure 1:
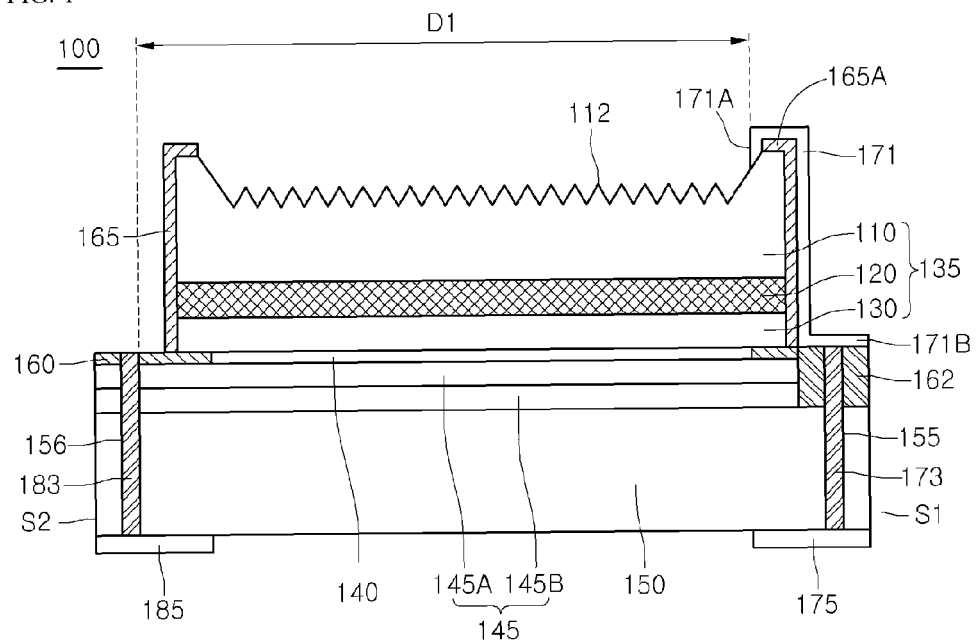
FIG. 1 is a side sectional view showing a light emitting device according to the first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

FIG. 1 is a sectional view showing a light emitting device package according to the first embodiment.

Referring to FIG. 1, the light emitting device 100 includes a first conductive type semiconductor layer 110, an active layer 120, a second conductive type semiconductor layer 130, a conductive layer 140, an adhesive layer 145, a support member 150, a first insulating layer 160, a second insulating layer 162, a third insulating layer 165, a contact electrode 171, a first electrode 173, a second electrode 183, a first lead electrode 175 and a second lead electrode 185.

The light emitting device 100 includes an LED having a plurality of compound semiconductor layers including group III-V elements. The LED may include a visible-band LED that emits light having blue, green and red colors, or an UV (ultraviolet) LED. The LED can emit the light by using various semiconductors within the technical scope of the embodiment.

The light emitting structure layer 135 includes the first conductive type semiconductor layer 110, the active layer 120 and the second conductive type semiconductor layer 130. The first conductive type semiconductor layer 110 is formed on the active layer 120, and the second conductive type semiconductor layer 130 is formed under the active layer 120. The first conductive type semiconductor layer 110 has a thickness at least thicker than a thickness of the second conductive type semiconductor layer 130.

The first conductive type semiconductor layer 110 includes the group III-V compound semiconductor doped with the first conductive dopant. In detail, the first conductive type semiconductor layer 110 may include one selected from the group consisting of GaN, AlN, AlGaN, InGaN, InN, InAlGaN, AlInN, AlGaAs, GaP, GaAs, GaAsP, and AlGaInP. For instance, the first conductive type semiconductor layer 110 may include the semiconductor material having the compositional formula of $In_xAl_yGa_{1-x-y}N$ ($0 \leq x \leq 1$, $0 \leq y \leq 1$, $0 \leq x+y \leq 1$). If first conductive type semiconductor layer 110 is an N type semiconductor layer, the first conductive dopant includes the N type dopant such as Si, Ge, Se or Te. The first conductive type semiconductor layer 110 can be prepared as a single layer or a multiple layer, but the embodiment is not limited thereto.

The first conductive type semiconductor layer 110 is formed on the top surface thereof with a light extracting structure 112. The light extracting structure 112 may include a roughness or a pattern formed on the top surface of the first conductive type semiconductor layer 110. The roughness or the pattern has a side sectional shape including at least one of a hemispherical shape, a polygonal shape, a conical shape and a nano-column shape. The roughness or the pattern may have regular or irregular size and interval. The light extracting structure 112 varies the critical angle of the light incident into the top surface of the first conductive type semiconductor layer 110 to improve the light extraction efficiency. An inner part of an upper portion of the first conductive type semiconductor layer 110 may be thinner than an outer part of the upper portion of the first conductive type semiconductor layer 110, but the embodiment is not limited thereto.

A current spreading layer can be formed on the first conductive type semiconductor layer 110. The current spreading layer may include a conductive material having a refractive index lower than that of a compound semiconductor. The current spreading layer may include metal oxide or a metal nitride, such as ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), ITON, IZON, IrOx, RuOx, RuOx/ITO, Ni/TrOx/Au, or Ni/IrOx/Au/ITO, but the embodiment is not limited thereto.

The active layer 120 may be formed under the first conductive type semiconductor layer 110. The active layer 120 may include at least one of a single quantum well structure, a multiple quantum well (MQW) structure, a quantum wire structure or a quantum dot structure.

The active layer 120 may have a stack structure of well/ barrier layers by using a compound semiconductor material of group III-V elements. For example, the well layer may include a semiconductor layer having a compositional formula of $In_xAl_yGa_{1-x-y}N$ ($0 \leq x \leq 1$, $0 \leq y \leq 1$, $0 \leq x+y \leq 1$), and the barrier layer may include a semiconductor layer having a compositional formula of $In_xAl_yGa_{1-x-y}N$ ($0 \leq x \leq 1$, $0 \leq y \leq 1$, $0 \leq x+y \leq 1$). The barrier layer may include a material having bandgap greater than that of the well layer.

The active layer 120 may include at least one of InGaN well/GaN barrier layers, InGaN well/AlGaN barrier layers, and InGaN well/InGaN barrier layers.

A conductive clad layer can be formed on and/or under the active layer 120. The conductive clad layer may include a GaN-based semiconductor and has a bandgap higher than a bandgap of the barrier layer.

The second conductive type semiconductor layer 130 is formed under the active layer 120. The second conductive type semiconductor layer 130 includes the group III-V compound semiconductor doped with second conductive dopant. For instance, the second conductive type semiconductor layer 130 may include one selected from the group consisting of GaN, AlN, AlGaN, InGaN, InN, InAlGaN, AlInN, AlGaAs, GaP, GaAs, GaAsP, and AlGaInP. The second conductive type semiconductor layer 130 may include a semiconductor layer having the compositional formula of $In_xAl_yGa_{1-x-y}N$ ($0 \leq x \leq 1$, $0 \leq y \leq 1$, and $0 \leq x+y \leq 1$).

If second conductive type semiconductor layer 130 is a P type semiconductor layer, the second conductive dopant includes the P type dopant such as Mg or Zn. The second conductive type semiconductor layer 130 can be prepared as a single layer or a multiple layer, but the embodiment is not limited thereto.

In addition, a third conductive type semiconductor layer having a polarity opposite to that of the second conductive type semiconductor layer 130 may be formed under the second semiconductor layer 130. Thus, the light emitting structure layer 135 may include at least one of an N—P junction structure, a P—N junction structure, an N—P—N junction structure, and a P—N—P junction structure. In the following description, a structure in which the second conductive type semiconductor layer 130 is provided at the lowest layer of the light emitting structure layer 135 will be described as an example.

The conductive layer 140 is disposed under the second conductive type semiconductor layer 130. In addition, the adhesive layer 145 is disposed under the conductive layer 140 and the support member 150 is disposed under the adhesive layer 145. The conductive layer 140 may be defined as a contact layer or an ohmic-contact layer.

The conductive layer 140 may include at least one conductive material. Preferably, the conductive layer 140 is prepared as a single layer or a multiple layer. The conductive layer 140 has an ohmic property and makes contact with a lower surface of the second conductive type semiconductor layer 130 in the form of a layer or a plurality of patterns. The conductive layer 140 may include at least one of a metal, oxide and nitride. For instance, the conductive layer 140 may include at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni/IrOx/Au, Ni/IrOx/Au/ITO, Pt, Ni, Au, Rh and Pd. In addition, the conductive layer 140 can be prepared as a single layer or a multiple layer by using Ag, Ni, Al, Rh, Pd, Ir, Ru, Mg, Zn, Pt, Au, Hf or an alloy including at least two of the above elements.

The conductive layer 140 includes a first conductive layer making ohmic-contact with the lower surface of the second conductive type semiconductor layer 130 and a second conductive layer formed under the first conductive layer and including a reflective metal. The reflective metal has reflectivity of at least 50%.

The conductive layer 140 may extend to the lower surface of the first insulating layer 160 from the lower surface of the second conductive type semiconductor layer 130, but the embodiment is not limited thereto.

A conductive material pattern or an insulating material pattern can be formed between the conductive layer 140 and the second conductive type semiconductor layer 130. This pattern may attenuate resistance variation between contact interfacial surfaces.

The adhesive layer 145 is formed between the support member 150 and the conductive layer 140. The adhesive layer 145 may include at least one metal or conductive material. For instance, the adhesive layer 145 includes a barrier metal or a bonding metal. The adhesive layer 145 may include at least one selected from the group consisting of Sn, Ga, In, Bi, Cu, Ni, Ag, Mo, Al, Au, Nb, W, Ti, Cr, Ta, Al, Pd, Pt, Si, Al—Si, Ag—Cd, Au—Sb, Al—Zn, Al—Mg, Al—Ge, Pd—Pb, Ag—Sb, Au—In, Al—Cu—Si, Ag—Cd—Cu, Cu—Sb, Cd—Cu, Al—Si—Cu, Ag—Cu, Ag—Zn, Ag—Cu—Zn, Ag—Cd—Cu—Zn, Au—Si, Au—Ge, Au—Ni, Au—Ag—Cu, Cu—Cu2 O, Cu—Zn, Cu—P, Ni—B, Ni—Mn—Pd, Ni—P, and Pd—Ni, but the embodiment is not limited thereto. The adhesive layer 145 may include a material different from the material for the conductive layer 140, but the embodiment is not limited thereto. The adhesive layer 145 may be defined as a bonding layer.

The adhesive layer 145 includes first and second adhesive layers 145A and 145B, in which the first adhesive layer 145A is disposed under the conductive layer 140, and the second adhesive layer 145B is disposed under the first adhesive layer 145A. The first and second adhesive layers 145A and 145B are bonded to each other while being electrically connected to each other.

An area of a top surface of the adhesive layer 145 is at least larger than an area of a lower surface of the light emitting structure layer 135.

The adhesive layer 145 can be formed on a part or a whole area of the lower surface of the first insulating layer 160, but the embodiment is not limited thereto.

The support member 150 may include an insulating material, such as $Al_2O_3$ or ZnO. The support member 150 is not used in the process of growing the semiconductor layers 110, 120 and 130 and separately disposed under the chip. In the following description of the embodiment, the insulating substrate including sapphire ($Al_2O_3$) will be used as an example for the support member 150.

An inner portion of the first insulating layer 160 is disposed between the adhesive layer 145 and the second conductive type semiconductor layer 130 and an outer portion of the first insulating layer 160 extends outward beyond the lateral side of the light emitting structure layer 135.

The first insulating layer 160 is disposed at an outer side of the adhesive layer 145 so that the lateral side of the light emitting structure layer 135 is spaced apart from the adhesive layer 145 by the first insulating layer 160.

The second insulating layer 162 is disposed at the lateral side of the conductive layer 140 and the adhesive layer 145. The thickness of the second insulating layer 162 is at least thicker than the thickness of the adhesive layer 145. Preferably, the thickness of the second insulating layer 162 corresponds to the gap between the light emitting structure layer 135 and the support member 150.

The third insulating layer 165 can be prepared as a single layer or a multiple layer around the semiconductor layers 110, 120 and 130. The third insulating layer 165 is formed on the top surface of the first insulating layer 160 and the lateral side of the light emitting structure layer 135. A portion 165A of the third insulating layer 165 may extend to an outer peripheral portion of a top surface of the first conductive type semiconductor layer 110. The third insulating layer 165 can prevent the interlayer short of the light emitting structure layer 135 while preventing moisture from infiltrating into the light emitting structure layer 135.

The first to third insulating layers 160, 162 and 165 may include one selected from the group consisting of $SiO_2$, $SiO_x$, $SiO_xN_y$, $Si_3N_4$, $Al_2O_3$, and $TiO_2$, but the embodiment is not limited thereto.

A plurality of holes 155 and 156 are formed at different regions of the support member 150.

That is, one or plural first holes 155 are formed in the support member 150. The first hole 155 can be prepared as a through hole or a via hole in the first region of the support member 150. An area of a lower portion of the first hole 155 is at least larger than an area of an upper portion of the first hole 155. The first electrode 173 is formed in the first hole 155. A lower surface of the first electrode 173 is exposed through the lower surface of the support member 150 and a top surface of the first electrode 173 is exposed through a top surface of the second insulating layer 162 via a lateral side or an inside of the second insulating layer 162. That is, the first electrode 173 extends from the lower surface of the support member 150 to the top surface of the second insulating layer 162. The first electrode 173 may protrude beyond the top surface of the support member 150, but the embodiment is not limited thereto.

The first electrode 173 can be prepared as a single layer or a multiple layer by using one of Cr, Ti, Al, In, Ta, Pd, Co, Ni, Si, Ge, Ag, Cu, Au and an alloy thereof, but the embodiment is not limited thereto.

One or plural second holes 156 are formed in the support member 150. The second hole 156 can be prepared as a through hole or a via hole in the second region of the support member 150. An area of a lower portion of the second hole 156 is at least larger than an area of an upper portion of the second hole 156.

The second electrode 183 is formed in the second hole 156. A lower surface of the second electrode 183 is exposed through the lower surface of the support member 150 and a top surface of the second electrode 183 may extend beyond the top surface of the support member 150. The top surface of the second electrode 183 makes contact with the adhesive layer 145. Preferably, the second electrode 183 makes contact with the first insulating layer 160 by passing through an inside of the adhesive layer 145.

The top surface of the second electrode 183 can be exposed through the top surface of the first insulating layer 160, but the embodiment is not limited thereto.

The second electrode 183 can be prepared as a single layer or a multiple layer by using at least one of Ti, Al, an Al alloy, In, Ta, Pd, Co, Ni, Si, Ge, Ag, an Ag alloy, Au, Hf, Pt, Ru, and an alloy thereof, but the embodiment is not limited thereto.

The first electrode 173 is closer to the first lateral side S1 of the support member 150 than to the second lateral side S2 of the support member 150, and the second electrode 183 is closer to the second lateral side S2 of the support member 150 than to the first lateral side S1 of the support member 150. The first and second lateral sides S1 and S2 are different side from or opposite side to each other. An interval between the first and second electrodes 173 and 183 is at least larger than a width of the light emitting structure layer 135, but the embodiment is not limited thereto. The first and second electrodes 173 and 183 are aligned in the region which is not overlapped with the light emitting structure layer 135 in the vertical direction. The overlap direction may include a thickness direction of the light emitting structure layer 135 or the support member 150.

One or plural contact electrodes 171 having a linear shape can be provided. The contact electrode 171 electrically connects the first electrode 173 to the first conductive type semiconductor layer 110. The contact electrode 171 is provided at the lateral side of the third insulating layer 165 in such a manner that a first contact portion 171A of the contact electrode 171 can make contact with the top surface of the first conductive type semiconductor layer 110 and a second contact portion 171B of the contact electrode 171 can make contact with the first electrode 173. The top surface of the first conductive type semiconductor layer 110 is an N-face electrically connected to the first contact portion 171A.

The contact electrode 171 makes ohmic-contact with the top surface of the first conductive type semiconductor layer 110 and includes a metal having superior adhesive, reflective and conductive properties. For instance, the contact electrode 171 can be prepared as a single layer or a multiple layer by using one selected from the group consisting of Cr, Ti, Al, In, Ta, Pd, Co, Ni, Si, Ge, Ag, Cu, Au and an alloy thereof, but the embodiment is not limited thereto.

The first contact portion 171A of the contact electrode 171 is spaced apart from the second electrode 183 by a first predetermined distance D1, which is equal to or longer than the width of the light emitting structure layer 135. The first contact portion 171A of the contact electrode 171 is located opposite to the first electrode 183, so that the current efficiency can be improved.

The first and second lead electrodes 175 and 185 are provided under the support member 150. The first and second lead electrodes 175 and 185 are spaced apart from each other and serve as pads, respectively.

The first lead electrode 175 is connected to the lower surface of the first electrode 173 and the second lead electrode 185 is connected to the lower surface of the second electrode 183. The first and second lead electrodes 175 and 185 can be prepared as a single layer or a multiple layer by using one selected from the group consisting of Cr, Ti, Al, an Al alloy, In, Ta, Pd, Co, Ni, Si, Ge, Ag, an Ag alloy, Cu, Au, Ni, Pt, Hf, and Ru.

FIGS. 2 to 10 are sectional views showing the procedure for manufacturing the light emitting device of FIG. 1.

Figure 2:
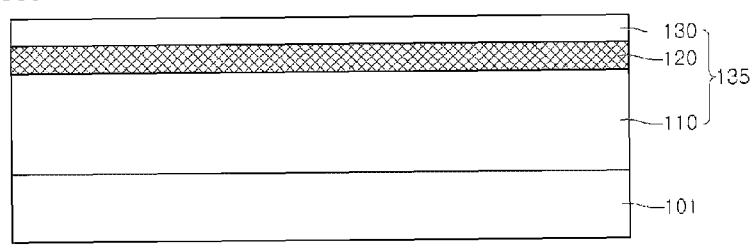
FIGS. 2 to 10 are sectional views showing the procedure for manufacturing the light emitting device shown in FIG. 1.

Referring to FIG. 2, a first substrate 101 is loaded in growth equipment and layers or patterns including group II to VI compound semiconductors are formed on the first substrate 101.

The growth equipment may be selected from the group consisting of E-beam evaporator, PVD (Physical Vapor Deposition), CVD (Chemical Vapor Deposition), PLD (Plasma Laser Deposition), dual-type thermal evaporator, sputtering, and MOCVD (Metal Organic Chemical Vapor Deposition), but the embodiment is not limited thereto.

The first substrate 101 is a growth substrate using a conductive substrate or an insulating substrate. For instance, the first substrate 101 may include one selected from the group consisting of $Al_2O_3$, GaN, SiC, ZnO, Si, GaP, InP, $Ga_2O_3$, and GaAs. A concave-convex pattern having a lens shape or a stripe shape can be formed on the top surface of the first substrate 101. In addition, a compound semiconductor layer is formed on the first substrate 101. The compound semiconductor layer can be prepared as a layer or a pattern by using group II to VI compound semiconductors. For instance, the compound semiconductor layer may include at least one of a ZnO layer (not shown), a buffer layer (not shown) and an undoped semiconductor layer (not shown). The buffer layer or the undoped semiconductor layer can be formed by using group III-V compound semiconductors, the buffer layer can attenuate the lattice mismatch with respect to the substrate, and the undoped semiconductor layer may include an undoped GaN-based semiconductor.

The first conductive type semiconductor layer 110 is formed on the first substrate 101, the active layer 120 is formed on the first conductive type semiconductor layer 110, and the second conductive type semiconductor layer 130 is formed on the active layer 120. Other layers can be formed on and/or under the above layers, and the embodiment is not limited thereto.

The first conductive type semiconductor layer 110 includes the group compound semiconductor doped with the first conductive dopant. In detail, the first conductive type semiconductor layer 110 may include one selected from the group consisting of GaN, AlN, AlGaN, InGaN, InN, InAlGaN, AlInN, AlGaAs, GaP, GaAs, GaAsP, and AlGaInP. For instance, the first conductive type semiconductor layer 110 may include the semiconductor material having the compositional formula of $In_xAl_yGa_{1-x-y}N$ ($0 \leq x \leq 1$, $0 \leq y \leq 1$, $0 \leq x+y \leq 1$). If first conductive type semiconductor layer 110 is an N type semiconductor layer, the first conductive dopant includes the N type dopant such as Si, Ge, Se or Te. The first conductive type semiconductor layer 110 can be prepared as a single layer or a multiple layer, but the embodiment is not limited thereto.

The active layer 120 may be formed on the first conductive type semiconductor layer 110. The active layer 120 may include at least one of a single quantum well structure, a multiple quantum well (MQW) structure, a quantum wire structure or a quantum dot structure. The active layer 120 may have a stack structure of well/barrier layers by using a compound semiconductor material of group III-V elements. For example, the well layer may include a semiconductor layer having a compositional formula of $In_xAl_yGa_{1-x-y}N$ ($0 \leq x \leq 1$, $0 \leq y \leq 1$, $0 \leq x+y \leq 1$), and the barrier layer may include a semiconductor layer having a compositional formula of $In_xAl_yGa_{1-x-y}N$ ($0 \leq x \leq 1$, $0 \leq y \leq 1$, $0 \leq x+y \leq 1$). The barrier layer may include a material having bandgap greater than that of the well layer.

A conductive clad layer can be formed on and/or under the active layer 120. The conductive clad layer may include a GaN-based semiconductor and has a bandgap higher than a bandgap of the active layer. The bandgap of the barrier layer may be higher than that of the well layer, and the bandgap of the conductive clad layer may be higher than the bandgap of the barrier layer.

The active layer 120 may include at least one of InGaN well/GaN barrier layers, InGaN well/AlGaN barrier layers, and InGaN well/InGaN barrier layers.

A conductive clad layer can be formed on and/or under the active layer 120. The conductive clad layer may include a GaN-based semiconductor and has a bandgap higher than a bandgap of the barrier layer.

The second conductive type semiconductor layer 130 is formed on the active layer 120. The second conductive type semiconductor layer 130 includes the group III-V compound semiconductor doped with second conductive dopant. For instance, the second conductive type semiconductor layer 130 may include one selected from the group consisting of GaN, AlN, AlGaN, InGaN, InN, InAlGaN, AlInN, AlGaAs, GaP, GaAs, GaAsP, and AlGaInP. The second conductive type semiconductor layer 130 may include a semiconductor layer having the compositional formula of $In_xAl_yGa_{1-x-y}N$ ($0 \leq x \leq 1$, $0 \leq y \leq 1$, and $0 \leq x+y \leq 1$).

If second conductive type semiconductor layer 130 is a P type semiconductor layer, the second conductive dopant includes the P type dopant such as Mg or Zn. The second conductive type semiconductor layer 130 can be prepared as a single layer or a multiple layer, but the embodiment is not limited thereto.

The first conductive type semiconductor layer 110, the active layer 120 and the second conductive type semiconductor layer 130 may constitute the light emitting structure layer 135. In addition, the third conductive type semiconductor layer having a polarity opposite to that of the second conductive type semiconductor layer 130 may be formed on the second semiconductor layer 130. Thus, the light emitting structure layer 135 may include at least one of an N—P junction structure, a P—N junction structure, an N—P—N junction structure, and a P—N—P junction structure. In the following description, a structure in which the second conductive type semiconductor layer 130 is provided at the uppermost layer of the light emitting structure layer 135 will be described as an example.

Figure 3:
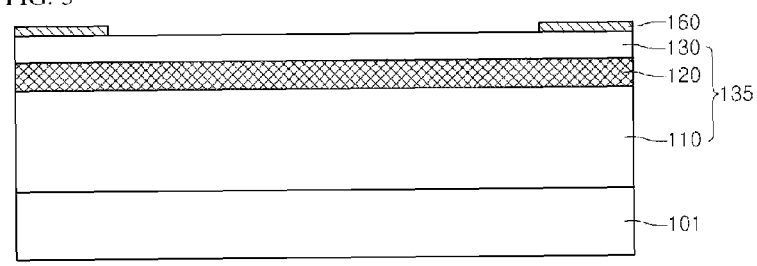
Figure 4:
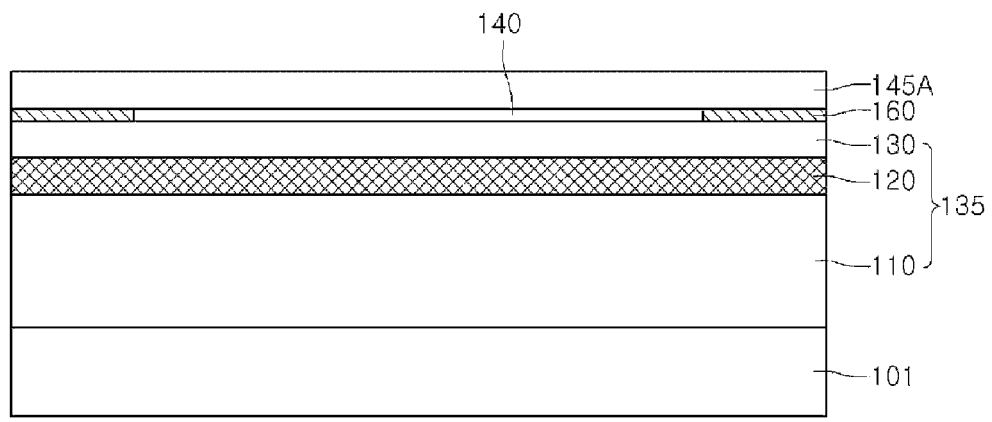

Referring to FIGS. 3 and 4, the first insulating layer 160 is formed on an outer peripheral portion of the top surface of the second conductive type semiconductor layer 130. The first insulating layer 160 can be formed through the photoresist process by using $SiO_2$, $SiO_x$, $SiO_xN_y$, $Si_3N_4$, $Al_2O_3$, or $TiO_2$, but the embodiment is not limited thereto.

The first insulating layer 160 may have a loop shape or a frame shape and can be continuously or discontinuously formed.

The conductive layer 140 is formed on the second conductive type semiconductor layer 130 through the sputtering process or the deposition process, but the embodiment is not limited thereto.

The conductive layer 140 may include a material having an ohmic property. The conductive layer 140 makes ohmic-contact with a top surface of the second conductive type semiconductor layer 130 in the form of a layer or a plurality of patterns. The conductive layer 140 may include at least one of a metal, transmittive oxide and transmittive nitride. For instance, the conductive layer 140 may include at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni/IrOx/Au, Ni/IrOx/Au/ITO, Pt, Ni, Au, Rh and Pd. In addition, the conductive layer 140 can be prepared as a single layer or a multiple layer by using Ag, Ni, Al, Rh, Pd, Ir, Ru, Mg, Zn, Pt, Au, Hf or an alloy including at least two of the above elements.

In addition, conductive oxide or an insulating material can be partially provided between the conductive layer 140 and the second conductive type semiconductor layer 130 to increase the resistance value thereof.

The first adhesive layer 145A is formed on the conductive layer 140. The first adhesive layer 145A extends onto the top surface of the first insulating layer 160. The first adhesive layer 145A may include a barrier metal or a bonding metal. For instance, the first adhesive layer 145A may include at least one of Ti, Au, Sn, Ni, Cr, Ga, In, Bi, Cu, Ag and Ta, but the embodiment is not limited thereto.

The first adhesive layer 145A can be formed through the sputtering scheme, the deposition scheme, the printing scheme, or the plating scheme, but the embodiment is not limited thereto.

Figure 5:
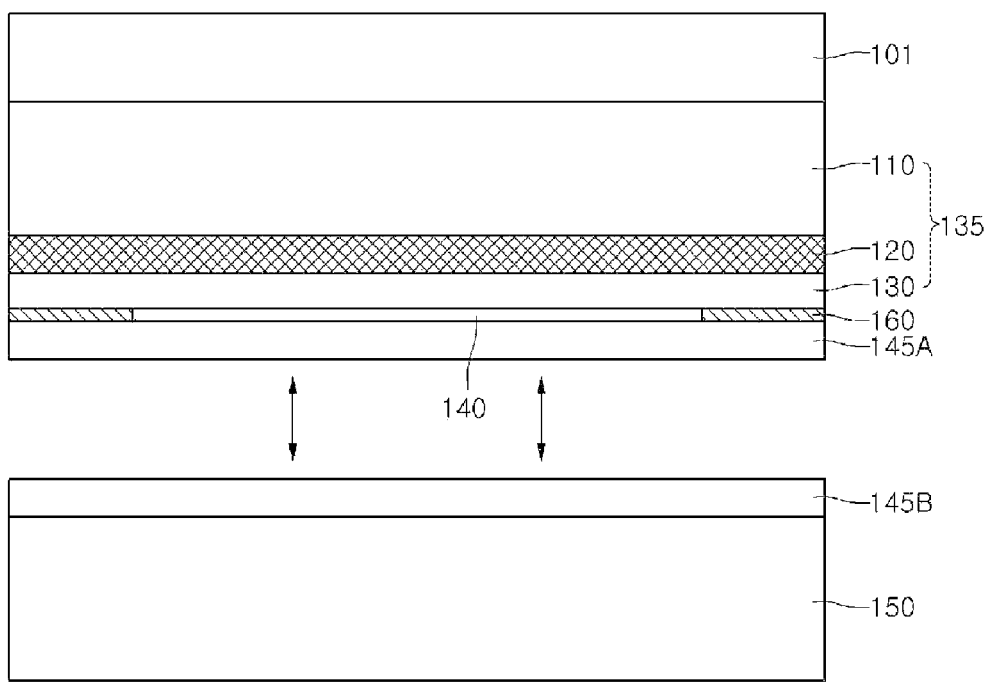

Referring to FIGS. 4 and 5, the support member 150 may serve as a second substrate. The second substrate is an insulating substrate including $Al_2O_3$ or ZnO. The support member 150 may include a material having no great difference in thermal expansion coefficient with respect to the semiconductor. The support member 150 may include a material identical to the material for the first substrate 101. The conductive substrate can be used as the support member 150, but the embodiment is not limited thereto.

The second adhesive layer 145B is formed on the support member 150. The second adhesive layer 145B includes at least one metal or a conductive material. The second adhesive layer 145B may include a barrier metal or a bonding metal. For instance, the second adhesive layer 145B includes at least one selected from the group consisting of Ti, Au, Sn, Ni, Cr, Ga, In, Bi, Cu, Ag and Ta, but the embodiment is not limited thereto.

The second adhesive layer 145B can be formed through the sputtering scheme, the deposition scheme, the printing scheme, or the plating scheme, but the embodiment is not limited thereto.

The second adhesive layer 145B may include a material identical to or different from a material for the first adhesive layer 145A. Preferably, the second adhesive layer 145B may include a material identical to a material for the first adhesive layer 145A.

As shown in FIG. 5, the first adhesive layer 145A is aligned on the second adhesive layer 145B.

Figure 6:
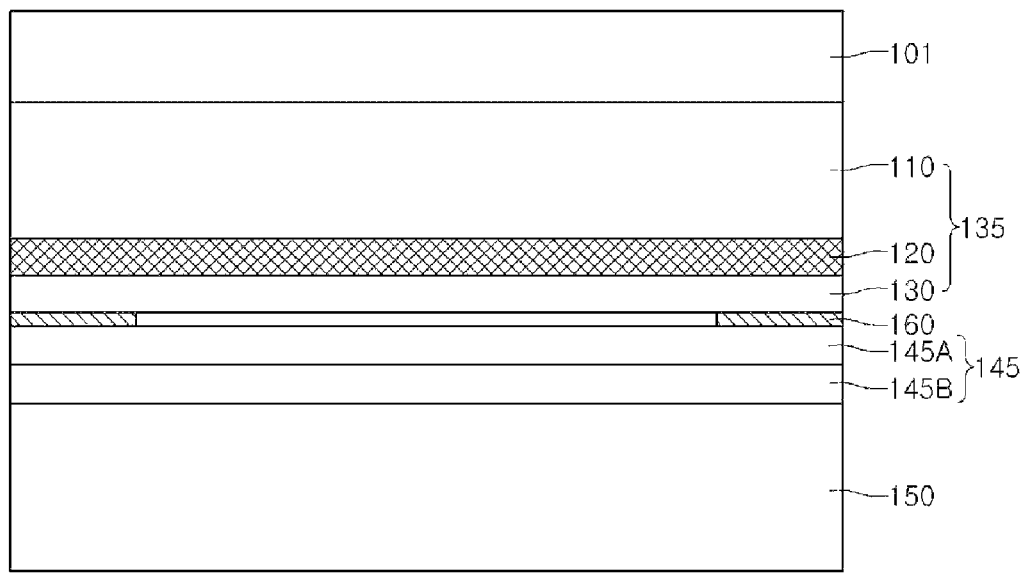
Figure 7:
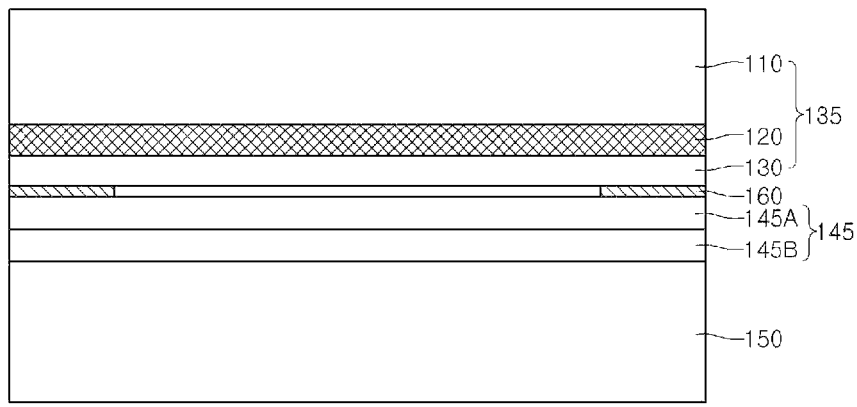

Referring to FIGS. 6 and 7, the first adhesive layer 145A is bonded onto the second adhesive layer 145B. The support member 150 is disposed on the base, and the first substrate 101 serves as the uppermost layer. The first and second adhesive layers 145A and 145B may constitute the adhesive layer 145.

The first substrate 101 can be removed through the physical and/or chemical scheme. In detail, the first substrate 101 is removed through the laser lift off (LLO) scheme. According to the LLO scheme, a laser beam having a predetermined wavelength is irradiated onto the first substrate 101 to lift off the first substrate 101. In addition, if another semiconductor (for instance, the buffer layer) is provided between the first substrate 101 and the first conductive type semiconductor layer 110, the buffer layer is removed by a wet etchant to separate the first substrate 101. The top surface of the first conductive type semiconductor layer 110 is exposed as the first substrate 101 has been removed. The top surface of the first conductive type semiconductor layer 110 is an N-face, which is closer to the first substrate.

The top surface of the first conductive type semiconductor layer 110 can be etched through the ICP/RIE (Inductively coupled Plasma/Reactive Ion Etching) or can be polished by using polishing equipment, but the embodiment is not limited thereto.

Figure 8:
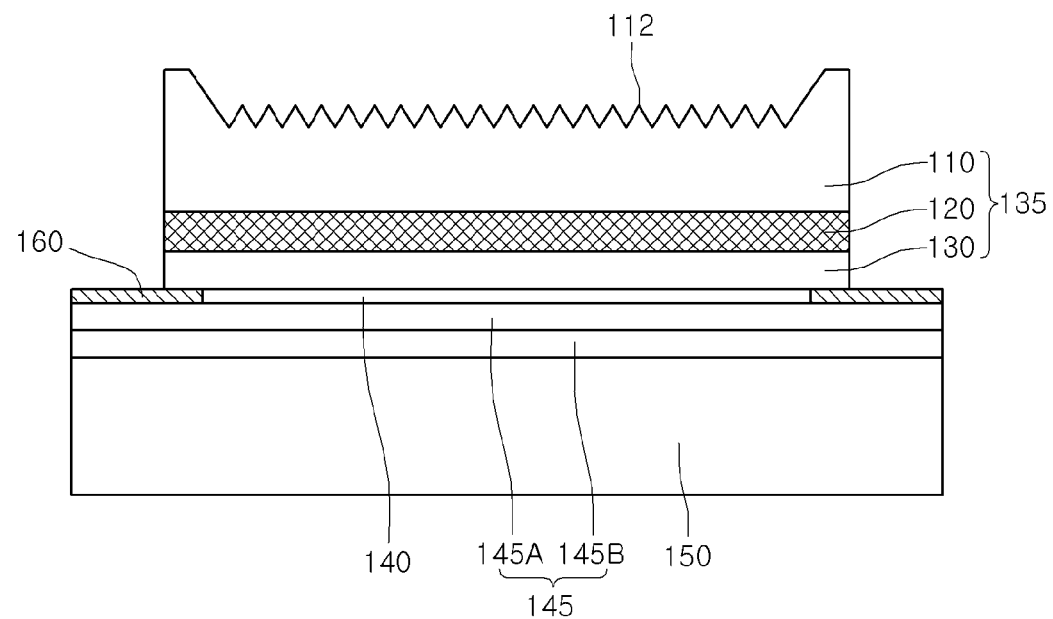

Referring to FIGS. 7 and 8, the first etching process is performed to expose the first insulating layer 160. The first etching process mainly includes the dry etching process. The wet etching process can be added during the first etching process. The outer peripheral portion of the light emitting structure layer 135 is removed through the first etching process, so that the chip boundary regions may be removed. The chip boundary regions are channel regions or isolation regions.

The first conductive type semiconductor layer 110 is formed on the top surface thereof with the light extracting structure 112. The light extracting structure 112 may include a roughness or a pattern formed on the top surface of the first conductive type semiconductor layer 110. The light extracting structure 112 can be formed through the wet etching process or the dry etching process.

Figure 9:
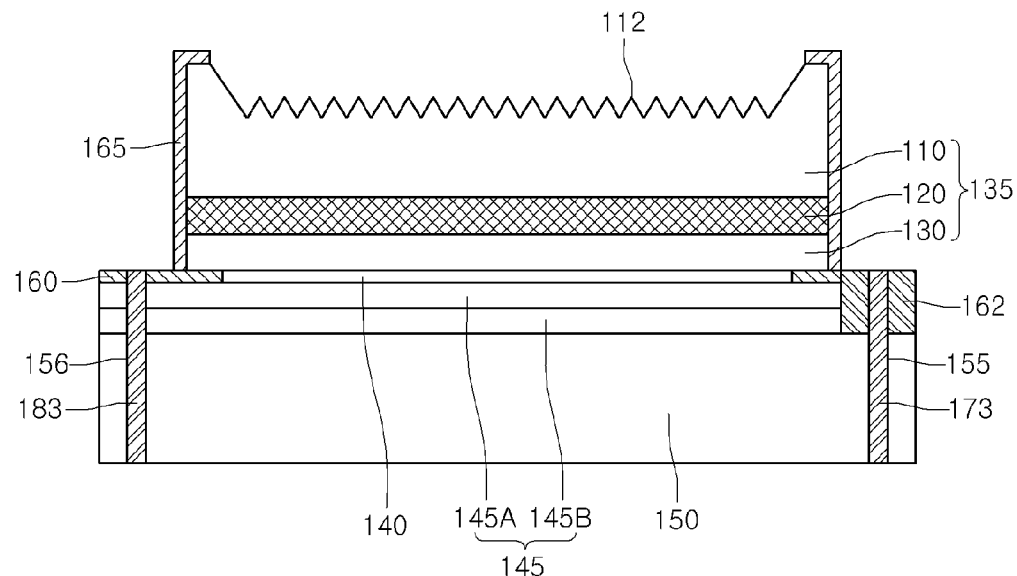

Referring to FIGS. 8 and 9, the top surface of the first insulating layer 160 is partially exposed by etching a part of the adhesive layer 145 and a part of the first insulating layer 160. The part of the adhesive layer 145 and the part of the first insulating layer 160 are disposed outward beyond the lateral side of the light emitting structure layer 135, so that the support member 150 can be exposed through the etching process. The etching process may include the wet etching process or the dry etching process, and the embodiment is not limited thereto. The second insulating layer 162 is partially formed on the top surface of the support member 150 and the inner portion of the second insulating layer 161 makes contact with the lateral sides of the adhesive layer 145 and the first insulating layer 160.

According to another embodiment, the second insulating layer 162 can be formed before the first and second adhesive layers 145 and 145B have been formed, but the embodiment is not limited thereto.

The first and second holes 155 and 156 are formed in the support member 150. The first and second holes 155 and 156 can be formed through the laser process and/or the drilling process.

The area of the upper portion of the first and second holes 155 and 156 may be different from the area of the lower portion of the first and second holes 155 and 156. In detail, the area of the lower portion of the first and second holes 155 and 156 may be larger than the area of the upper portion of the first and second holes 155 and 156. The first and second holes 155 and 156 may include through holes or via holes and have circular shapes, polygonal shapes or random shapes when viewed from the top.

One or plural first holes 155 are formed in the support member 150. The first hole 155 is formed in the first region of the support member 150 and extends to an upper portion of the second insulating layer 162. One or plural second holes 156 are formed in the support member 150. The second hole 156 is formed in the second region of the support member 150 and extends to at least a part of the adhesive layer 145. The second hole 156 extends to an inside of the first insulating layer 160 by passing through the adhesive layer 145 such that the second hole 156 can be exposed through the top surface of the first insulating layer 160. When viewed from the top, the first region of the support member 150 is different from the second region of the support member 150, preferably, opposite to the second region of the support member 150.

The first electrode 173 is provided in the first hole 155 and the second electrode 183 is provided in the second hole 156. The first and second electrodes 183 can be formed through the deposition scheme, the plating scheme or the insertion scheme.

The first electrode 173 is closer to the first lateral side of the support member 150 than to the second lateral side of the support member 150, and the second electrode 183 is closer to the second lateral side of the support member 150 than to the first lateral side of the support member 150. The first and second lateral sides are different from or opposite to each other. An interval between the first and second electrodes 173 and 183 is at least larger than a width of the light emitting structure layer 135, but the embodiment is not limited thereto. The first and second electrodes 173 and 183 are aligned in the region which is not overlapped with the light emitting structure layer 135 with respect to the vertical direction or the thickness direction of the light emitting structure layer 135.

A lower surface of the first electrode 173 is exposed through the lower surface of the support member 150 and a top surface of the first electrode 173 is exposed through a top surface of the second insulating layer 162 via a lateral side or an inside of the second insulating layer 162. That is, the first electrode 173 extends from the lower surface of the support member 150 to the top surface of the second insulating layer 162. The first electrode 173 may protrude beyond the top surface of the support member 150, but the embodiment is not limited thereto.

The second electrode 183 may extend from the lower surface of the support member 150 to the top surface of the first insulating layer 160.

The first electrode 173 extends by passing through the support member 150 and the second insulating layer 162. The second electrode 183 extends by passing through the first insulating layer 160, the adhesive layer 145 and the support member 150.

The first electrode 173 can be prepared as a single layer or a multiple layer by using one of Cr, Ti, Al, In, Ta, Pd, Co, Ni, Si, Ge, Ag, Cu, Au and an alloy thereof, but the embodiment is not limited thereto.

The second electrode 183 can be prepared as a single layer or a multiple layer by using at least one of Ti, Al, an Al alloy, In, Ta, Pd, Co, Ni, Si, Ge, Ag, an Ag alloy, Au, Hf, Pt, Ru, and an alloy thereof, but the embodiment is not limited thereto.

The third insulating layer 165 is formed at the outer peripheral portion of the semiconductor layers 110, 120 and 130, the upper end of the third insulating layer 165 may extend to the outer peripheral portion of the top surface of the first conductive type semiconductor layer 110 and the lower end of the third insulating layer 165 makes contact with the first insulating layer 160 and/or the second insulating layer 162.

Figure 10:
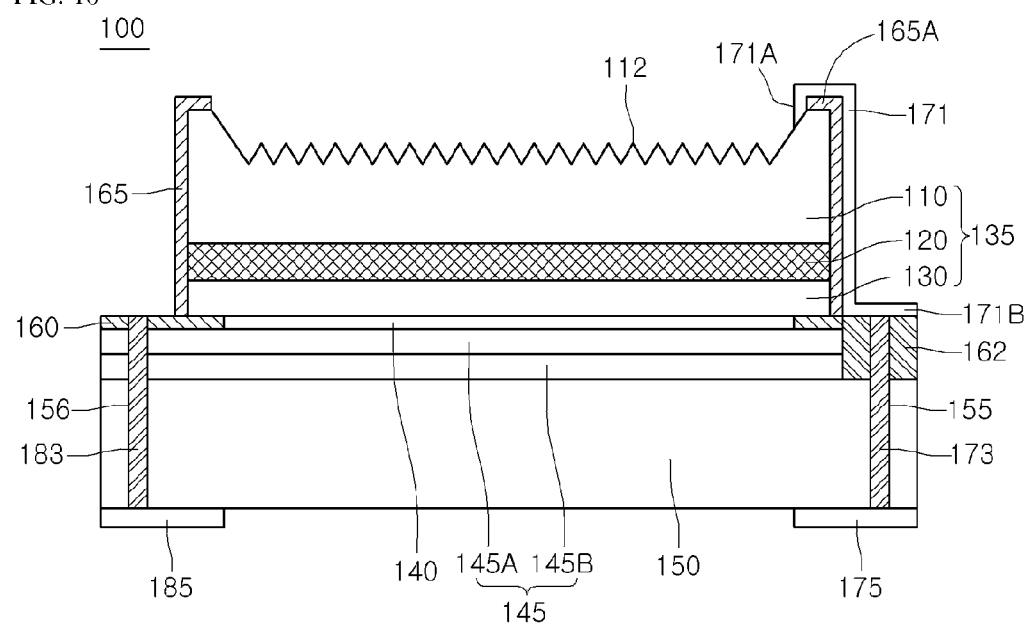

Referring to FIGS. 9 and 10, the contact electrode 171 is formed on the outer peripheral portion of the third insulating layer 165. The first contact portion 171A of the contact electrode 171 makes contact with a part of the top surface of the first conductive type semiconductor layer 110, and the second contact portion 171B of the contact electrode 171 makes contact with the top surface of the first electrode 173. The contact electrode 171 can be prepared in the form of at least one line. The first contact portion 171A of the contact electrode 171 may have a pattern, such as a branch, a finger or arm pattern, a radial pattern or a linear pattern, so that uniform current distribution can be realized.

The contact electrode 171 can be prepared as a single layer or a multiple layer by using one selected from the group consisting of Cr, Ti, Al, In, Ta, Pd, Co, Ni, Si, Ge, Ag, Cu, Au and an alloy thereof. The contact electrode 171 makes ohmic-contact with the N-face of the first conductive type semiconductor layer 110 and has superior adhesive, reflective and conductive properties.

The first and second lead electrodes 175 and 185 are provided under the support member 150. One or plural first lead electrodes 175 are provided under the support member 150 to make contact with the first electrode 173. In addition, one or plural second lead electrodes 185 are provided under the support member 150 to make contact with the second electrode 173.

The first and second lead electrodes 175 and 185 are spaced apart from each other and serve as pads, respectively.

The first lead electrode 175 is electrically connected to the first conductive type semiconductor layer 110 through the first electrode 173 and the contact electrode 171. In addition, the second lead electrode 185 is electrically connected to the second conductive type semiconductor layer 130 through the second electrode 173, the adhesive layer 145 and the conductive layer 140.

A current spreading layer can be formed on the first conductive type semiconductor layer 110. The current spreading layer is a transmittive layer and includes one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), ITON, IZON, IrOx, RuOx, RuOx/ITO, Ni/IrOx/Au, and Ni/IrOx/Au/ITO to spread the current over the whole area. The current spreading layer can make contact with the first contact portion 171A of the contact electrode 171.

A plurality of contact electrodes 171 are provided while being spaced apart from each other to supply the current to the first conductive type semiconductor layer 110 by spreading the current.

Figure 11:
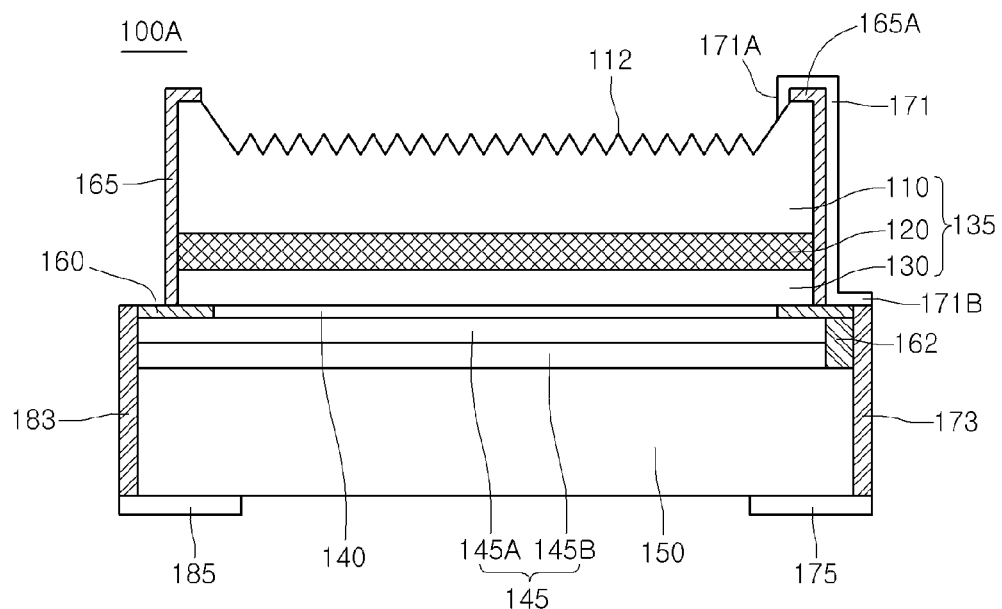
FIG. 11 is a side sectional view showing a light emitting device according to the second embodiment.

FIG. 11 is a side sectional view showing a light emitting device according to the second embodiment. In the following description of the second embodiment, the elements and structures that have been described in the first embodiment will be omitted in order to avoid redundancy.

Referring to FIG. 11, the light emitting device 100A includes the first and second electrodes 173 and 183 disposed on two different lateral sides of the support member 150, respectively. In detail, the first electrode 173 is disposed on the first lateral side of the support member 150 and the second electrode 183 is disposed on the second lateral side of the support member 150. The first lateral side is adjacent to or opposite to the second lateral side.

Figure 12:
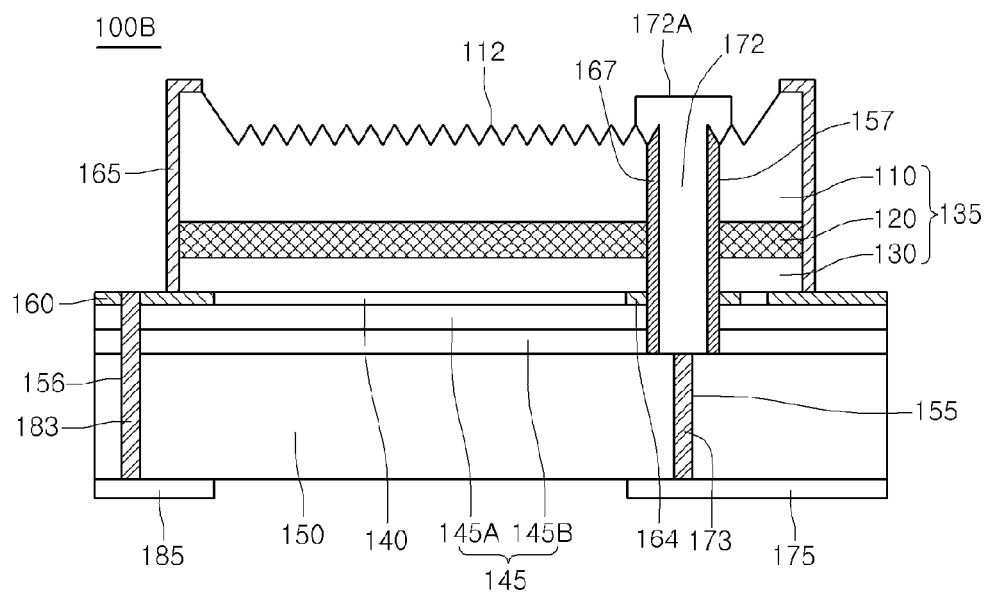
FIG. 12 is a side sectional view showing a light emitting device according to the third embodiment.

FIG. 12 is a side sectional view showing a light emitting device according to the third embodiment. In the following description of the third embodiment, the elements and structures that have been described in the first embodiment will be omitted in order to avoid redundancy.

Referring to FIG. 12, one of the first electrode 173 and the contact electrode 172 of the light emitting device 100B may overlap with a portion of the light emitting structure layer 135. The first electrode 173 is formed in the first hole 155 of the support member while overlapping with the light emitting structure layer 135 in the vertical direction or the thickness direction of the light emitting structure layer 135. The first electrode 173 is disposed in the support member 150 and the contact electrode 172 extends in the thickness direction of the light emitting structure layer 135 from the first electrode 173.

A third hole 157 is formed through the adhesive layer 145, the conductive layer 140 and the light emitting structure layer 135. One or plural third holes 157 can be provided. When viewed from the top, the third hole 157 has a circular shape or a polygonal shape.

A fourth insulating layer 167 is formed around the third hole 157, and the contact electrode 172 is formed in the fourth insulating layer 167. The fourth insulating layer 167 insulates the contact electrode 172 from other layers 120, 130, 140 and 145.

The contact portion 172A of the contact electrode 172 protrudes beyond the top surface of the first conductive type semiconductor layer 110 and makes contact with the top surface of the first conductive type semiconductor layer 110. The contact portion 172A of the contact electrode 172 may have a width larger than a width of the third hole 157.

One or plural contact electrode 172 and first electrodes 173 can be provided, and the embodiment is not limited thereto. The first electrode 173 may have a height different from a height of the second electrode 183.

The contact electrode 172 is spaced apart from the second electrode 183 by a predetermined distance corresponding to a half or more based on the width of the light emitting structure layer 135.

A current blocking layer 164 can be further provided between the light emitting structure layer 135 and the adhesive layer 145. The current blocking layer 164 includes an insulating material and is provided around the third hole 157 such that the current blocking layer 164 may overlap with the contact portion 172A of the contact electrode 172 in the vertical direction or the thickness direction of the light emitting structure layer 135. The insulating material may include at least one of $SiO_2$, $SiO_x$, $SiO_xN_y$, $Si_3N_4$, $Al_2O_3$, and $TiO_2$. The current blocking layer 164 may be omitted, and the embodiment is not limited thereto.

Figure 13:
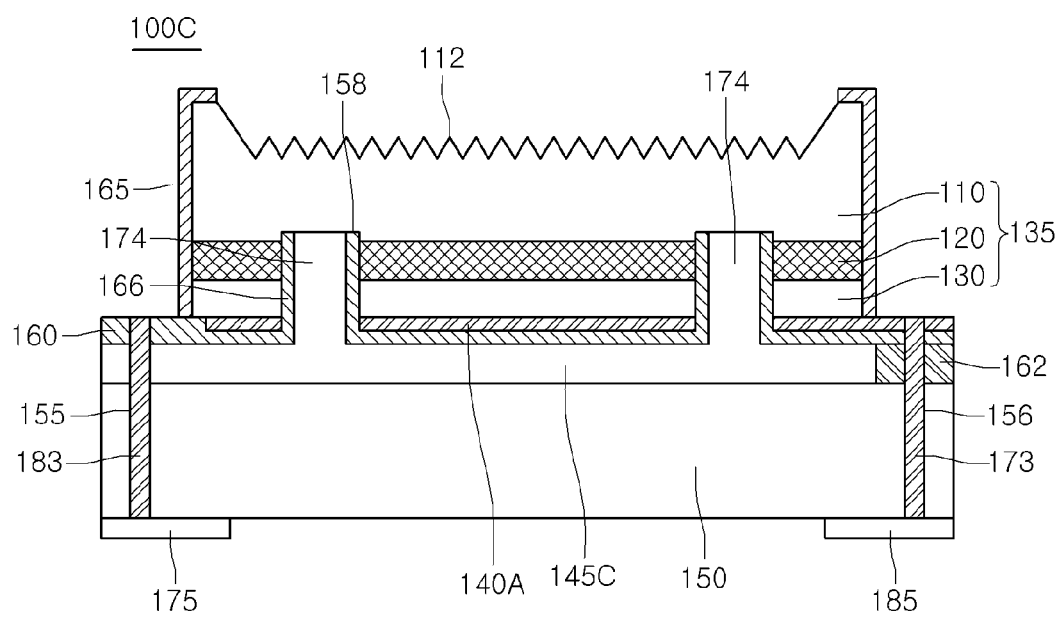
FIG. 13 is a side sectional view showing a light emitting device according to the fourth embodiment.

FIG. 13 is a side sectional view showing a light emitting device according to the fourth embodiment. In the following description of the fourth embodiment, the elements and structures that have been described in the first embodiment will be omitted in order to avoid redundancy.

Referring to FIG. 13, a plurality of contact electrodes 174 are provided in the light emitting structure layer 135 of the light emitting device 100C. The contact electrodes 174 are aligned on a third adhesive layer 145C.

The conductive layer 140A is formed under the second conductive type semiconductor layer 130 and the first insulating layer 160 is formed between the conductive layer 140A and the third adhesive layer 145C. The conductive layer 140A makes ohmic-contact with the second conductive type semiconductor layer 130 and includes a reflective layer. First and second adhesive layers as shown in FIG. 1 can be further provided between the conductive layer 140A and the support member 150, but the embodiment is not limited thereto.

The conductive layer 140A is electrically isolated from the third adhesive layer 145C by the first insulating layer 160.

The first electrode 173 is formed in the first hole 155 and makes contact with the third adhesive layer 145C by passing through the support member 150. The plurality of contact electrodes 174 extend from the third adhesive layer 145C to the inside of the first conductive type semiconductor layer 110. The contact electrodes 174 are provided in a recess 158 and insulated from other layers 140A, 130 and 120 by a fourth insulating layer 166. An upper end of the contact electrode 174 makes contact with the inner lower surface of the first conductive type semiconductor layer 110. The inner lower surface of the first conductive type semiconductor layer 110 is a Ga-face. The plurality of contact electrodes 174 are not exposed to the top side of the light emitting device, so the light extraction area of the first conductive type semiconductor layer 110 can be increased.

The contact electrodes 174 can be formed after the conductive layer 140A has been formed or the recess 158 and the first insulating layer 160 have been formed, and the embodiment is not limited thereto.

The conductive layer 140A extends beyond the edge of the lower surface of the second conductive type semiconductor layer 130 and makes contact with the top surface of the second electrode 183. The second electrode 183 provided in the second hole 156 is exposed through the lower surface of the support member 150 and makes contact with the second lead electrode 185.

Figure 14:
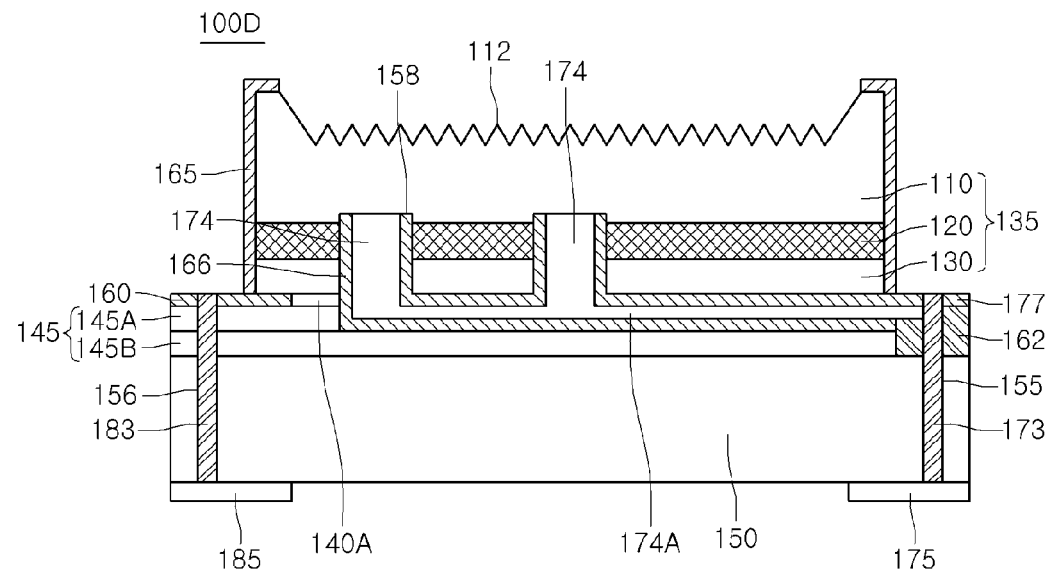
FIG. 14 is a side sectional view showing a light emitting device according to the fifth embodiment.

FIG. 14 is a side sectional view showing a light emitting device according to the fifth embodiment. In the following description of the fifth embodiment, the elements and structures that have been described in the previous embodiments will be omitted in order to avoid redundancy.

Referring to FIG. 14, the light emitting device 100D includes a plurality of contact electrodes 174, a fifth insulating layer 177 and the first electrode 173.

The contact electrodes 174 are provided in the recess 158 and insulated from other layers 120, 130, 140A and 145 by the fourth and fifth insulating layers 166 and 177. The contact electrodes 174 are not exposed to the top side of the light emitting device, but make contact with the inner lower surface of the first conductive type semiconductor layer 110. The inner lower surface of the first conductive type semiconductor layer 110 is a GaN-based Ga-face.

The contact electrodes 174 can be connected with each other by a predetermined branch pattern 174A under the second conductive type semiconductor layer 130.

The fourth and fifth insulating layers 166 and 177 are formed among the layers 140A, 130, 120 and 145 except for the first conductive type semiconductor layer 110 to prevent the electric short from occurring between the contact electrodes 174 and the branch patterns 174A thereof. The conductive layer 140A includes an ohmic layer and a reflective layer. The conductive layer 140A is formed on a region where the fifth insulating layer 177 is not formed and makes contact with the lower surface of the second conductive type semiconductor layer 130.

Some of the contact electrodes 174 can make contact with the first electrode 173. The power supplied to the first lead electrode 175 is fed to the first conductive type semiconductor layer 110 through the first electrode 173 and the contact electrodes 174. In addition, since the power is supplied through a plurality of contact electrodes 174, current concentration may not occur.

Figure 15:
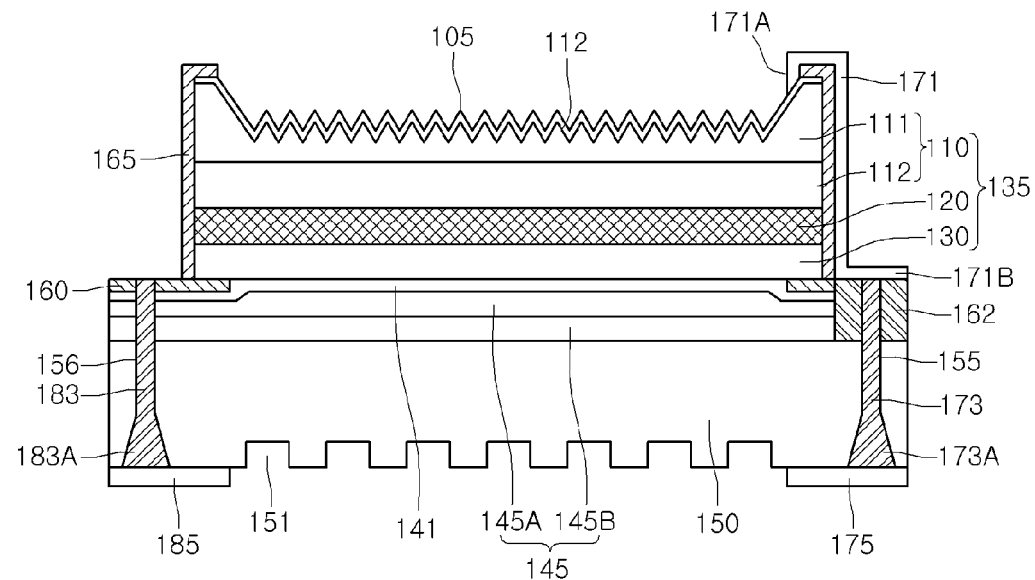
FIG. 15 is a side sectional view showing a light emitting device according to the sixth embodiment.

FIG. 15 is a side sectional view showing a light emitting device according to the sixth embodiment.

Referring to FIG. 15, the light emitting device includes a current spreading layer 105 on the first conductive type semiconductor layer 110. The current spreading layer 105 has an area corresponding to 50% or above based on an area of the top surface of the first conductive type semiconductor layer 110. The current spreading layer 105 is a roughness layer and makes contact with the lower surface of the first contact portion 171A of the contact electrode 171 to spread the current over the whole area of the light emitting device.

The current spreading layer 105 is disposed between the first contact portion 171A of the contact electrode 171 and the first conductive type semiconductor layer 110 to improve the current efficiency as well as the light extraction efficiency.

The current spreading layer 105 may include transmittive oxide or transmittive nitride. In detail, the current spreading layer 105 may include a material having a refractive index lower than that of the first conductive type semiconductor layer 110. For instance, the current spreading layer 105 may include one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), ITON, IZON, IrOx, RuOx, RuOx/ITO, Ni/IrOx/Au, or Ni/IrOx/Au/ITO.

The first conductive type semiconductor layer 110 may include a first semiconductor layer 111 and a second semiconductor layer 112 under the first semiconductor layer 111. The dopant concentration, the thickness or the compositional formula of the first semiconductor layer 111 may be different from that of the second semiconductor layer 112. The dopant concentration of the first semiconductor layer 111 may be higher than that of the second semiconductor layer 112. For instance, the first semiconductor layer 111 having high conductivity can be disposed on the second semiconductor layer 112 having low conductivity. In addition, the first semiconductor layer 111 may include an AlGaN layer and the second semiconductor layer 112 may include a GaN layer. Further, the bandgap of the first semiconductor layer 111 may be different from the bandgap of the second semiconductor layer 112. The first and second semiconductor layers 111 and 112 can be repeatedly stacked by at least two times, but the embodiment is not limited thereto.

The first and second semiconductor layers 111 and 112 may have the super lattice structure (SLS). In addition, the first and second semiconductor layers 111 and 112 may include one selected from the group consisting of GaN, MN, InGaN, AlGaN, InAlGaN, $SiO_2$, $SiO_x$, $SiN_2$, $SiN_x$, $SiO_xN_y$, and a metallic material. The super lattice structure includes at least two different layers, which are alternately stacked by at least two times. For instance, the super lattice structure includes the stack structure of InGaN/GaN. Each layer of the super lattice structure may have a thickness of at least a few Å.

In addition, the stack structure of the first and second semiconductor layers 111 and 112 may include a reflective layer in which at least two layers having different refractive indexes are alternately stacked. For example, the stack structure may include a DBR (Distributed Bragg Reflectors) having at least two stack structures of GaN/AlN layers.

The second conductive type semiconductor layer 130 may include the super lattice structure identical to that of the first conductive type semiconductor layer 110. For instance, the second conductive type semiconductor layer 130 may include a first layer having a compositional formula of $In_xAl_yGa_{1-x-y}N$ ($0 \leq x \leq 1$, $0 \leq y \leq 1$, $0 \leq x+y \leq 1$) and a second layer having a compositional formula of $In_xAl_yGa_{1-x-y}N$ ($0 \leq x \leq 1$, $0 \leq y \leq 1$, $0 \leq x+y \leq 1$) under the first layer. The dopant concentration, the thickness or the compositional formula of the first layer may be different from that of the second layer.

An outer portion of the conductive layer 141 extends to the lower surface of the first insulating layer 160 to make contact with the adhesive layer 145. Due to the above structure, the first adhesive layer 145A can be prevented from fling off from the first insulating layer 160.

An area of the lower portions 173A and 183A of the first and second electrodes 173 and 183 may be larger than an area of the upper portions of the first and second electrodes 173 and 183.

In addition, a plurality of recesses 151 are formed on the lower surface of the support member 150. The recesses 151 may enlarge the surface area of the light emitting device, so that the heat dissipation efficiency can be improved.

Figure 16:
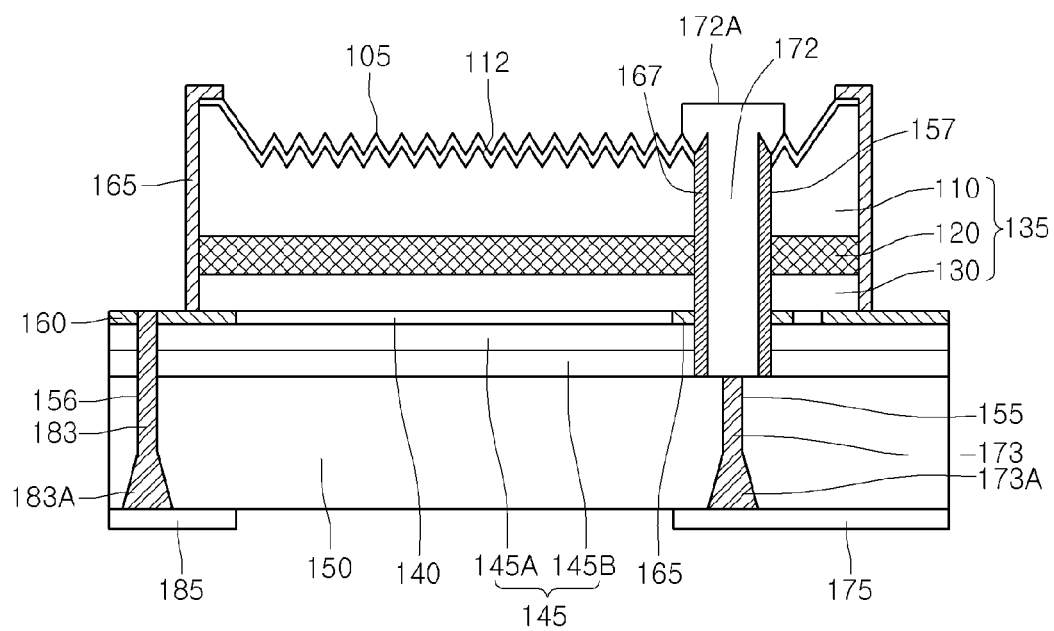
FIG. 16 is a side sectional view showing a light emitting device according to the seventh embodiment.

FIG. 16 is a modified example of FIG. 12.

Referring to FIG. 16, the light emitting device includes the current spreading layer 105 on the first conductive type semiconductor layer 110. The current spreading layer 105 makes contact with the lower surface of the contact portion 172A of the contact electrode 172. The contact portion 172A of the contact electrode 172 makes contact with the first conductive type semiconductor layer 110, but the embodiment is not limited thereto.

The current blocking layer 164 may overlap with the contact portion 172A of the contact electrode 172 in the vertical direction or the thickness direction of the light emitting structure layer 135, but the embodiment is not limited thereto.

Figure 17:
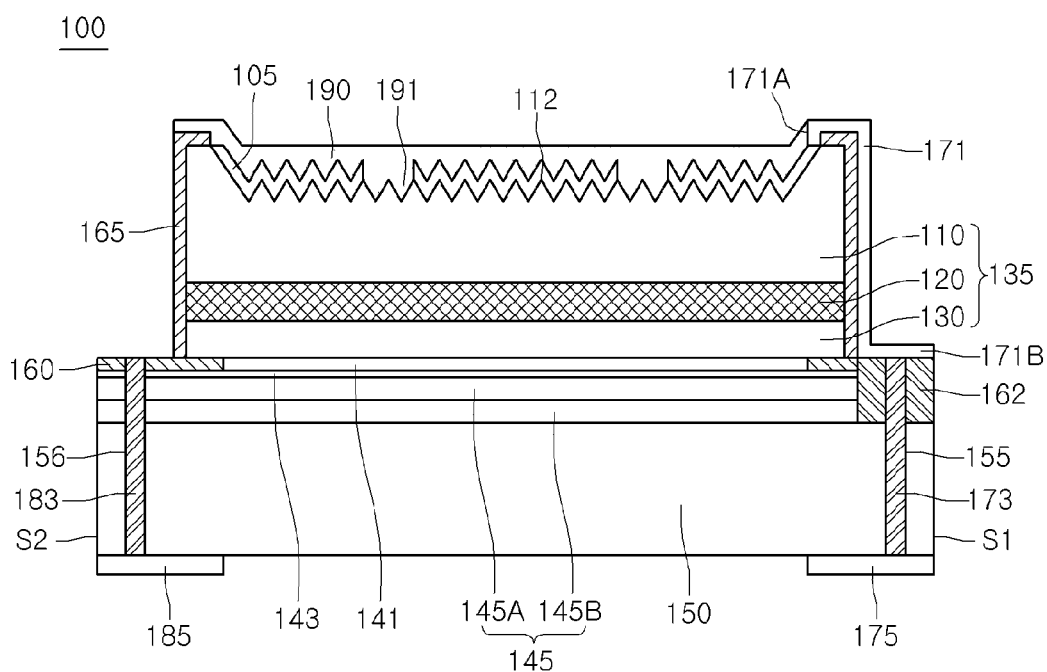
FIG. 17 is a side sectional view showing a light emitting device according to the eighth embodiment.

FIG. 17 is a modified example of FIG. 1.

Referring to FIG. 17, the light emitting device includes a first conductive layer 141 and a second conductive layer 143, in which the first conductive layer 141 includes a material having ohmic property and the second conductive layer 143 includes a material having reflective property. The first conductive layer 141 may serve as an ohmic contact layer. For instance, the first conductive layer 141 makes contact with the lower surface of the second conductive type semiconductor layer 130. The first conductive layer 141 can be prepared as a layer or a pattern. The second conductive layer 143 is formed under the first conductive layer 141 and has a width larger than a width of the first conductive layer 141. The second conductive layer 143 may include a reflective metal.

For instance, the first conductive layer 141 may include at least one selected from the group consisting of ITO (indium tin oxide), IZO (indium zinc oxide), IZON (IZO nitride), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni/IrOx/Au, Ni/IrOx/Au/ITO, Pt, Ni, Au, Rh and Pd.

In addition, the second conductive layer 143 can be prepared as a single layer or a multiple layer by using one selected from the group consisting of Ag, Ni, Al, Rh, Pd, Ir, Ru, Mg, Zn, Pt, Au, Hf and an alloy including at least two of the above elements.

The current spreading layer 105 is aligned on the first conductive type semiconductor layer 110. The current spreading layer 105 may be discontinuously formed. The current spreading layer 105 makes contact with the first contact portion 171A of the contact electrode 171.

A phosphor layer 190 is formed on the current spreading layer 105. The phosphor layer 190 may include a resin layer, such as a silicon layer or an epoxy layer. A part 191 of the phosphor layer 190 can make contact with the top surface of the first conductive type semiconductor layer 110. Phosphor materials can be added to the phosphor layer 190. In this case, the phosphor material may include at least one of YAG, TAG, nitride and oxynitride-based materials. The phosphor layer 190 can be prepared by distributing phosphor particles.

The thickness of the phosphor layer 190 is smaller than the thickness of the support member 150, but the embodiment is not limited thereto.

Figure 18:
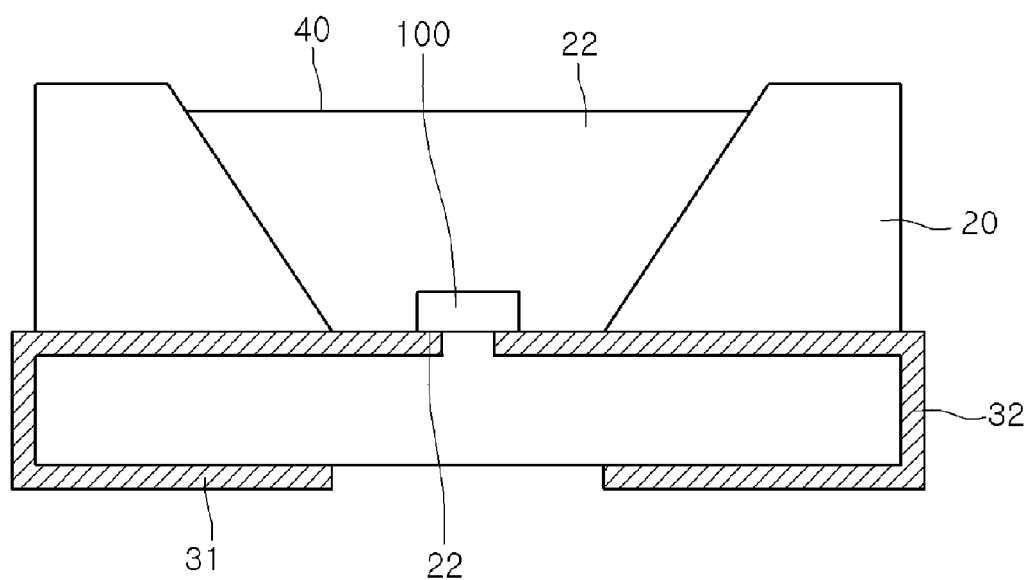
FIG. 18 is a side sectional view showing a light emitting device package according to the embodiment.

FIG. 18 is a sectional view showing a light emitting device package according to the embodiment.

Referring to FIG. 18, the light emitting device package 30 includes a body 20, first and second lead frames 31 and 32 formed on the body 20, the light emitting device 100 provided on the body 20 and electrically connected to the first and second lead frames 31 and 32 and a molding member 40 that surrounds the light emitting device 100.

The body 20 may be a conductive substrate including silicon, a synthetic resin substrate including polyphthalamide (PPA), a ceramic substrate, an insulating substrate, or a metal substrate such as a metal core PCB (MCPCB). An inclined surface may be formed around the light emitting device 100. The body 20 may have a through hole structure, but the embodiment is not limited thereto.

A cavity 22 can be formed at the upper portion of the body 20, and the first and second lead frames 31 and 32 and the light emitting device 100 are provided in the cavity 22. The body 20 may have a flat top surface. In this case, the cavity 22 can be omitted.

The first and second lead frames 31 and 32 are electrically isolated from each other to supply power to the light emitting device 100. In addition, the first and second lead frames 31 and 32 reflect the light emitted from the light emitting device 100 to improve the light efficiency and dissipate heat generated from the light emitting device 100 to the outside.

The light emitting device 100 can be installed on the body 20 or the first or second lead frame 31 or 32.

The light emitting device 100 according to the embodiments is bonded to the first and second lead frames 31 and 32 by a solder.

The molding member 40 includes a resin material, such as silicon or epoxy, and surrounds the light emitting device 100 to protect the light emitting device 100. In addition, the molding member 40 may include phosphor materials to change the wavelength of the light emitted from the light emitting device 100. A lens can be formed over the molding member 40. The lens may come into contact with the molding member 40 or may be spaced apart from the molding member 40. The lens may include a convex lens or a concave lens.

The light emitting device 100 can be electrically connected to the lower surface of the body or the substrate by way of the via hole.

At least one light emitting device according to the embodiment can be mounted in the light emitting device package, but the embodiment is not limited thereto.

Although the top-view type light emitting device package is disclosed in the embodiment, the side-view type light emitting device package can be used to improve the heat dissipation, conductivity and reflective characteristics. According to the top-view type light emitting device package or the side-view type light emitting device package, the light emitting device is packaged by using the resin layer and then the lens is formed on or bonded to the resin layer, but the embodiment is not limited thereto.

<Lighting System>

The light emitting device or the light emitting device package according to the embodiment can be applied to the lighting system. The lighting system includes a plurality of light emitting devices or a plurality of light emitting device packages which are arrayed in the light unit. The lighting system may include a lighting lamp, a signal lamp, a headlight of a vehicle, and an electric signboard.

Figure 19:
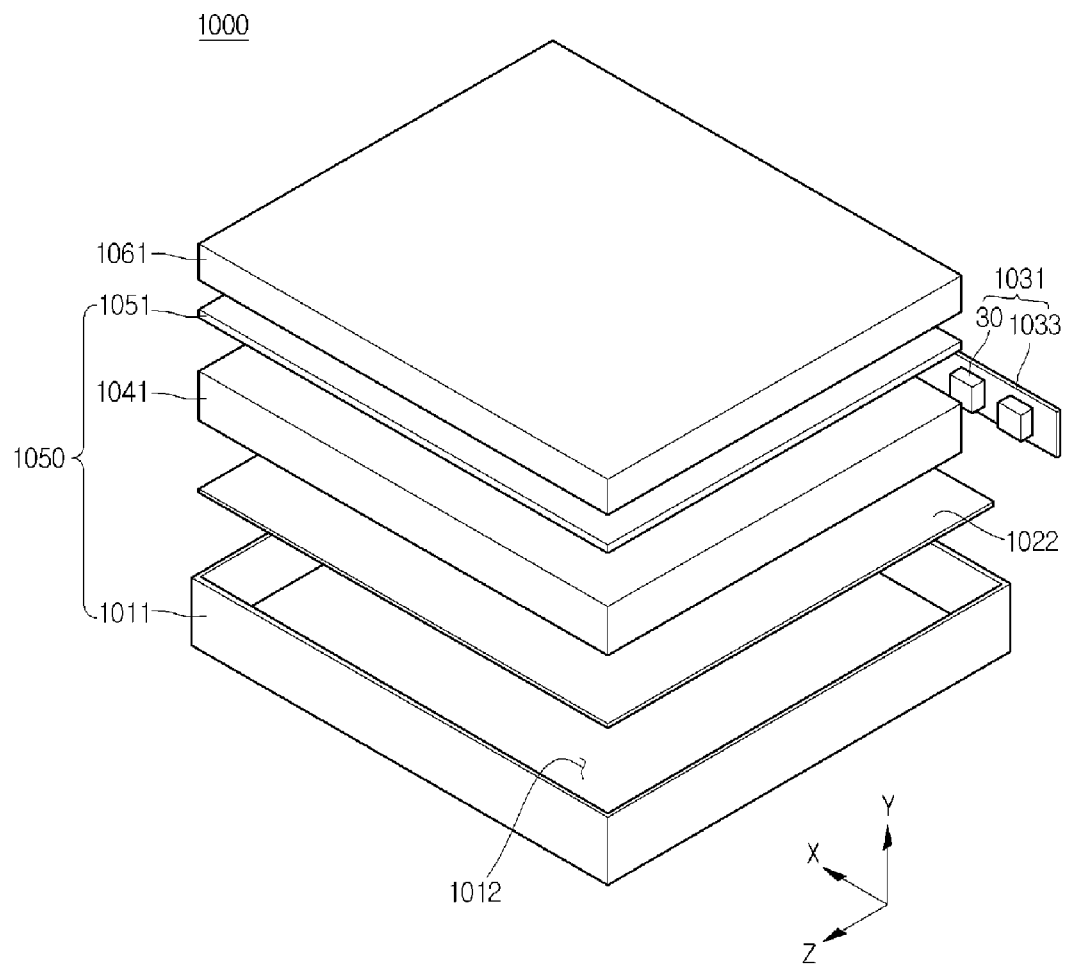
FIG. 19 is a diagram illustrating a display device according to an embodiment.
Figure 20:
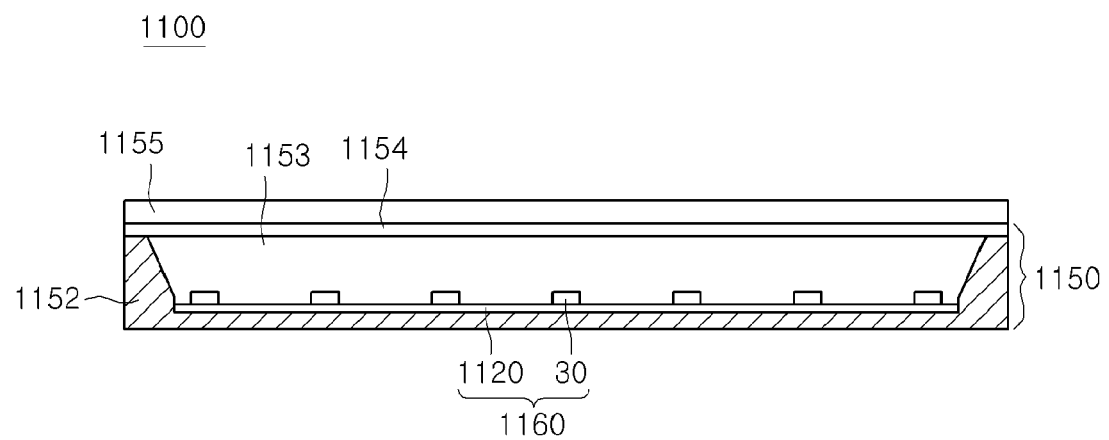
FIG. 20 is a diagram illustrating another display device according to an embodiment.
Figure 21:
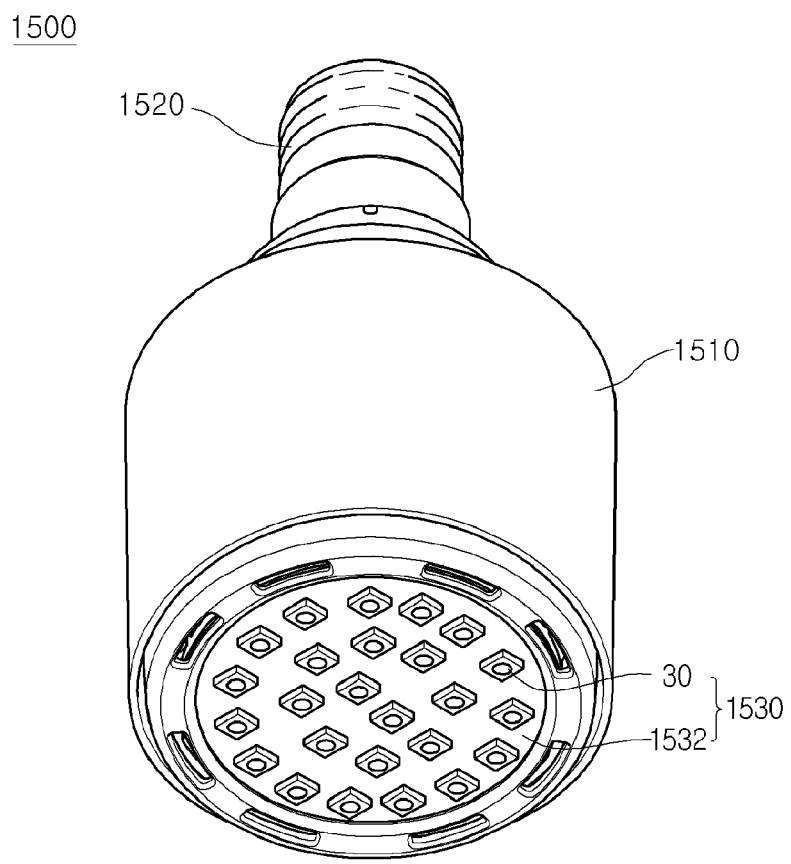
FIG. 21 is a diagram illustrating a lighting device according to an embodiment.

The lighting system may include display devices illustrated in FIGS. 19 and 20, a lighting device illustrated in FIG. 21, illumination lamps, signal lights, car headlights, electronic displays, and the like.

FIG. 19 is an exploded perspective view illustrating a display device according to an embodiment.

Referring to FIG. 19, a display device 1000 according to the embodiment may include a light guide plate 1041, a light emitting module 1031 providing light to the light guide plate 1041, a reflection member 1022 under the light guide plate 1041, an optical sheet 1051 on the light guide plate 1041, a display panel 1061 on the optical sheet 1051, and a bottom cover 1011 storing the light guide plate 1041, the light emitting module 1031, and the reflection member 1022; however, it is not limited to this.

The bottom cover 1011, the reflection sheet 1022, the light guide plate 1041, and the optical sheet 1051 may be defined as a light unit 1050.

The light guide plate 1041 serves to diffuse light for convergence to a surface light source. The light guide plate 1041 is formed with transparent material and, e.g., may include one of acrylic resin such as polymethyl metaacrylate (PMMA), polyethylene terephthlate (PET), poly carbonate (PC), cycloolefin copolymer (COC), and polyethylene naphthalate (PEN) resins.

The light emitting module 1031 provides light to at least one side of the light guide plate 1041 and ultimately acts as a light source of the display device.

At least one light emitting module 1031 is included, and it may provide light directly or indirectly at one side of the light guide plate 1041. The light emitting module 1031 includes a substrate 1033 and the light emitting device package 30 according to the above-disclosed embodiment. The light emitting device package 30 may be arrayed at predetermined intervals on the substrate 1033.

The substrate 1033 may be a Printed Circuit Board (PCB) including a circuit pattern (not illustrated). However, the substrate 1033 may include not only the typical PCB but also a metal core PCB (MCPCB) and a flexible PCB (FPCB), and it is not limited to this. In the case that the light emitting device package 30 is installed on the side of the bottom cover 1011 or on a heat radiating plate, the substrate 1033 may be eliminated. Herein, a part of the heat radiating plate may be contacted to an upper surface of the bottom cover 1011.

The plurality of light emitting device packages 30 may be installed on the substrate 1033 so that a light-emitting surface is separated from the light guide plate 1041 by a predetermined distance, and there is no limit for this. The light emitting device package 30 may provide light to a light-entering part, i.e., one side, of the light guide plate 1041 directly or indirectly, and there is no limit for this.

The reflection member 1022 may be disposed under the light guide plate 1041. The reflection member 1022 reflects the light incident to the lower surface of the light guide plate 1041 in an upward direction so that brightness of the light unit 1050 may be improved. The reflection member 1022 may be formed with, e.g., PET, PC, PVC (polyvinyl chloride) resins; however, it is not limited to this. The reflection member 1022 may be the upper surface of the bottom cover 1011; however, there is no limit for this.

The bottom cover 1011 may store the light guide plate 1041, the light emitting module 1031, and the reflection member 1022. To this end, the bottom cover 1011 may be provided with a storing unit 1012 having a shape of a box whose upper surface is open, and there is not limit for this. The bottom cover 1011 may be combined with a top cover, and there is no limit for this.

The bottom cover 1011 may be formed with metal material or resin material and may be fabricated using processes of press or extrusion molding. The bottom cover 1011 may also include metal or non-metal material having good thermal conductivity, and there is no limit for this.

The display panel 1061 is, e.g., an LCD panel, and includes transparent first and second substrates, and a liquid crystal layer between the first and second substrates. On at least one side of the display panel 1061, a polarizing plate may be attached; however, the attaching structure is not limited to this. The display panel 1061 displays information by the light which passes through the optical sheet 1051. The display device 1000 may be applied to various cell phones, monitors of notebook computers, monitors of laptop computers, and televisions.

The optical sheet 1051 is disposed between the display panel 1061 and the light guide plate 1041 and includes at least one translucent sheet. The optical sheet 1051 may include at least one of, e.g., diffusion sheet, horizontal and vertical prism sheets, and brightness enhancement sheet. The diffusion sheet diffuses the incident light. The horizontal or/and vertical prism sheet concentrates the incident light to a display region. The brightness enhancement sheet reuses lost light to enhance brightness. A protection sheet may be disposed on the display panel 1061, and there is no limit for this.

Herein, on the light path of the light emitting module 1031, the light guide plate 1041 and the optical sheet 1051 may be included as optical members; however, there is no limit for this.

FIG. 20 is a diagram illustrating a display device according to an embodiment.

Referring to FIG. 20, a display device 1100 includes a bottom cover 1152, a substrate 1120, an optical member 1154, and a display panel 1155. Herein, the above-disclosed light emitting device packages 30 are arrayed on the substrate 1120.

The substrate 1120 and the light emitting device package 30 may be defined as a light emitting module 1060. The bottom cover 1152, at least one light emitting module 1060, and the optical member 1154 may be defined as a light unit.

The bottom cover 1152 may be provided with a storing unit 1153, and there is no limit for this.

Herein, the optical member 1154 may includes at least one of the lens, light guide plate, diffusion sheet, horizontal and vertical prism sheets, and brightness enhancement sheet. The light guide plate may be formed with PC material or polymethyl metaacrylate (PMMA) material, and this light guide plate may be eliminated. The diffusion sheet diffuses the incident light. The horizontal or/and vertical prism sheet concentrates the incident light to the display region. The brightness enhancement sheet reuses lost light to enhance brightness.

The optical member 1154 is disposed on the light emitting module 1060. The optical member 1154 converts the light emitted from the light emitting module 1060 to the surface light source, or performs diffusing and concentrating light.

FIG. 21 is a perspective view illustrating an illumination device according to an embodiment.

Referring to FIG. 21, an illumination device 1500 may include a case 1510, a light emitting module 1530 installed to the case 1510, and a connection terminal 1520 installed to the case 1510 and provided with power from an external power source.

It is preferable to form the case 1510 with material which has good heat radiation characteristics. For instance, the case 1510 may be formed with metal material or resin material.

The light emitting module 1530 may include a substrate 1532 and the light emitting device package 30 according to the embodiment installed on the substrate 1532. The plurality of light emitting device packages 30 may be arrayed in a matrix form or may be arrayed being separated from each other at predetermined intervals.

The substrate 1532 may be an insulator where a circuit pattern is printed. For instance, the substrate 1532 may include the PCB, metal core PCB, flexible PCB, ceramic PCB, and FR-4 substrate.

The substrate 1532 may also be formed with material which efficiently reflects light, or its surface may be coated with color, e.g., white and silver, which efficiently reflects light.

At least one light emitting device package 30 may be installed on the substrate 1532. Each of the light emitting device packages 30 may include at least one Light Emitting Diode (LED) chip. The LED chip may include a light emitting diode of visible light such as red, green, blue, or white or a UV light emitting diode which emits Ultra Violet (UV).

A combination of various light emitting device packages 30 may be disposed in the light emitting module 1530 for obtaining color tone and brightness. For instance, for securing high Color Rendering Index (CRI), a white light emitting diode, a red light emitting diode, and a green light emitting diode may be combined and disposed.

The connection terminal 1520 may be electrically connected to the light emitting module 1530 to supply power. The connection terminal 1520 is screwed to be connected to the external power source in a socket method; however, there is no limit for this. For instance, the connection terminal 1520 may be formed as a pin shape to be inserted into the external power source or may be connected to the external power source by a wire.

According to the embodiment, the light emitting device packages including the light emitting devices are arranged on the substrate to provide a light emitting module or the light emitting devices are arranged on the substrate to provide the light emitting module.

The method of manufacturing the semiconductor light emitting device according to the embodiment may include the steps of forming a plurality of compound semiconductor layers including a first conductive type semiconductor layer, an active layer and a second conductive type semiconductor layer on a substrate; forming a first insulating layer on an outer peripheral portion of a top surface of the compound semiconductor layers; forming a contact layer on the compound semiconductor layers; forming a first adhesive layer on the contact layer; bonding a second adhesive layer to the first adhesive layer on a second substrate; removing the first substrate; etching a chip boundary region of the compound semiconductor layers; forming first and second electrodes by forming through holes in first and second regions of the second substrate; and forming a first contact electrode to connect the first electrode to the first conductive type semiconductor layer.

According to the embodiment, the pad can be removed from the top surface of the semiconductor layer so that the light extraction efficiency can be improved at the top surface of the semiconductor layer. The embodiment can increase the light emitting area as compared with the LED chip having the lateral type electrode structure. According to the embodiment, the bonding electrode is provided under the substrate so that the light emitting area can be enlarged. Therefore, according to the embodiment, the light efficiency can be enhanced and the reliability of the light emitting device can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a plurality of compound semiconductor layers including a first conductive type semiconductor layer, an active layer under the first conductive type semiconductor layer, and a second conductive type semiconductor layer under the active layer;
   a contact layer under the compound semiconductor layers;
   an adhesive layer under the contact layer;
   a first insulating layer disposed at an outer peripheral portion between the compound semiconductor layers and the adhesive layer;
   a substrate under the adhesive layer;
   a first electrode passing through a first region of the substrate;
   a first contact electrode electrically connecting the first electrode to the first conductive type semiconductor layer;
   a second electrode passing through a second region of the substrate, the second electrode electrically connected to the adhesive layer; and
   a second insulating layer insulating the first electrode from the contact layer.

2. The light emitting device of claim 1, wherein at least one of the first and second electrodes is disposed at an outer portion or an inner portion of the substrate.

3. The light emitting device of claim 1, further comprising a first lead electrode connected to the first electrode disposed under the substrate; and a second lead electrode connected to the second electrode disposed under the substrate.

4. The light emitting device of claim 1, wherein the contact layer includes at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni/IrOx/Au, Ni/IrOx/Au/ITO, Pt, Ni, Au, Rh, Pd, Ag, Al, Ir, Ru, Mg, Zn, Au, Hf, and the mixture of at least two above materials.

5. The light emitting device of claim 1, wherein the contact layer includes an ohmic layer under the compound semiconductor layers; and a reflective layer under the ohmic layer.

6. The light emitting device of claim 1, wherein at least one of the first and second electrodes is protruded higher than a top surface of the adhesive layer.

7. The light emitting device of claim 1, further comprising a third insulating layer at an outside portion of the compound semiconductor layers, wherein the first contact electrode is disposed at an outside portion of the third insulating layer and an upper portion of the first contact electrode makes contacts with a top surface of the first conductive type semiconductor layer.

8. The light emitting device of claim 1, wherein the first contact electrode passes through an inner area of the plurality of compound semiconductor layers and the contact layer, and the first contact electrode has an upper portion in contact with the first conductive type semiconductor layer.

9. The light emitting device of claim 8, further comprising a fourth insulating layer selectively isolated the first contact electrode from making contact with another layers.

10. The light emitting device of claim 9, wherein the first insulating layer extends to electrically insulate between the contact layer and the adhesive layer, the first contact electrode electrically connects between the adhesive layer and the first conductive type semiconductor layer, and the second electrode directly makes contact with the contact layer.

11. The light emitting device of claim 9, wherein the first contact electrode passes through the adhesive layer to the upper portion of the first conductive type semiconductor layer.

12. The light emitting device of claim 1, wherein the first conductive type semiconductor layer is an N type semiconductor, and the second conductive type semiconductor layer is a P type semiconductor.

\* \* \* \* \*